US006754110B2

United States Patent
Beer et al.

(12) United States Patent
(10) Patent No.: US 6,754,110 B2
(45) Date of Patent: Jun. 22, 2004

(54) EVALUATION CIRCUIT FOR A DRAM

(75) Inventors: Peter Beer, Tutzing (DE); Thilo Schaffroth, Röhrmoos (DE)

(73) Assignee: Infineon Technologies AG, Munich (DE)

( * ) Notice: Subject to any disclaimer, the term of this patent is extended or adjusted under 35 U.S.C. 154(b) by 15 days.

(21) Appl. No.: 10/190,814

(22) Filed: Jul. 8, 2002

(65) Prior Publication Data

US 2003/0007391 A1 Jan. 9, 2003

(30) Foreign Application Priority Data

Jul. 6, 2001  (DE) .......................................... 101 32 920

(51) Int. Cl.[7] .............................................. G11C 7/00
(52) U.S. Cl. ................... 365/189.07; 365/149; 365/205
(58) Field of Search ............................ 365/189.07, 149, 365/205

(56) References Cited

U.S. PATENT DOCUMENTS 5,668,765 A * 9/1997 Ang ........................... 365/205
6,147,918 A * 11/2000 Takashima et al. .......... 365/207
6,347,058 B1 * 2/2002 Houghton et al. .......... 365/203

* cited by examiner

*Primary Examiner*—Hoai Ho
(74) *Attorney, Agent, or Firm*—Laurence A. Greenberg; Werner H. Stemer; Gregory L. Mayback

(57) ABSTRACT

A circuit configuration for evaluating electrical charges of memory cells in a DRAM is provided. Signal lines within the evaluation circuit cross one another in order to reduce parasitic coupling capacitances between adjacent signal lines of a memory cell array.

7 Claims, 2 Drawing Sheets

EVALUATION CIRCUIT FOR A DRAM

BACKGROUND OF THE INVENTION

Field of the Invention

The invention relates to an evaluation circuit for evaluating the electrical charge of a memory cell and to a memory device having such an evaluation circuit.

Dynamic random access memories (DRAMs) include a plurality of memory cells which each include a storage capacitor and a selection transistor. These memory cells are addressed via word and bit lines which are provided as columns and rows. A memory cell is written to by charging the associated storage capacitor of the memory cell with an electrical charge corresponding to the respective binary data unit.

During a read-out operation, the stored charge is then read out and amplified by an evaluation circuit connected to the bit line of the memory cell and the electrical potential of the bit line is compared with the electrical potential of an associated reference line. Depending on the potential difference, the two electrical potentials are amplified to two predetermined potential values, the higher potential of the two lines generally being pulled to the potential of the supply voltage and the lower potential being pulled to the ground potential.

The storage capacitor loses its charge over time due to leakage currents within the memory cell. For this reason, the charge of a memory cell must continually be refreshed again by reading and rewriting at short time intervals.

The signals in large scale integrated memory cell configurations are exposed to numerous interference sources in particular within the bit lines which connect the memory cells to the evaluation circuits. In this case, primarily a coupling capacitance between bit lines running parallel to one another occurs as an interference factor. The electrical potential of a bit line is influenced by the electrical potentials of adjacent bit lines. The temporal fluctuation of this parasitic coupling signal causes a noise which is referred to as coupling noise and, on account of superposition with the actual signal, has an interfering effect during the read-out of the memory cell.

The decreasing distances—as a result of miniaturization—between adjacent bit lines of a large scale integrated memory cell configuration mean that the coupling capacitance between the bit lines rises, so that it often exceeds the capacitance of the memory cells by a multiple in the case of today's memory configurations. The coupling noise then reaches the order of magnitude of the actual signals, so that, in an unfavorable case, the actual charge state of the storage capacitor may be misinterpreted by the evaluation circuit.

In order to increase the reliability of such memory devices, it is therefore primarily attempted to reduce the coupling capacitances of the bit lines between the evaluation circuits and the memory cells. A bit line with reduced coupling capacitance has a more favorable signal-to-noise ratio, which is in turn manifested in the reduction of the error rate in the interpretation of the memory cell information.

The continuous trend toward ever higher storage densities necessitates further measures, however. In particular, it is found that further, hitherto largely unknown interference factors also play a part in the error rate of the information evaluation of the memory cells.

SUMMARY OF THE INVENTION

It is accordingly an object of the invention to provide a memory device which overcomes the above-mentioned disadvantages of the heretofore-known memory devices of this general type and which reduces the coupling capacitances of the signal lines within a memory cell configuration and which has a minimal error rate in the evaluation of the memory cell information.

With the foregoing and other objects in view there is provided, in accordance with the invention, a memory device, including:

a memory cell;
an evaluation circuit;
a reference line connected to the evaluation circuit
a bit line defining a bit line direction;
the memory cell being connected to the evaluation circuit via the bit line;
a first signal line, the bit line being connected, within the evaluation circuit, to the first signal line;
a second signal line, the reference line being connected, within the evaluation circuit, to the second signal line;
the bit line and the reference line having respective electrical potentials, the evaluation circuit amplifying a difference between the respective electrical potentials of the bit line and the reference line; and
the first and second signal lines having a crossover region within the evaluation circuit, the crossover region forming sections along the bit line direction in the evaluation circuit, the sections along the bit line direction having mutually substantially corresponding capacitances.

In other words, a memory device having a memory cell and an evaluation circuit is provided, the memory cell being connected to the evaluation circuit via a bit line, and a reference line being connected to the evaluation circuit, within the evaluation circuit the bit line being connected to a first signal line and the reference line being connected to a second signal line, and the evaluation circuit amplifying the difference between the electrical potentials of the bit line and the reference line, wherein the first and second signal lines have, within the evaluation circuit, a crossover region, the capacitances of the sections of the evaluation circuit which are formed by the crossover region in the bit line direction essentially mutually correspond to one another.

According to another feature of the invention, the first and second signal lines extend through the evaluation circuit; the evaluation circuit has two sides, the bit line and the reference line make contact with a respective one of the first signal line and the second signal line at the two sides of the evaluation circuit; and the bit line is connected to the memory cell on a first one of the two sides of the evaluation circuit and is connected to a further memory cell on a second one of the two sides of the evaluation circuit.

According to yet another feature of the invention, the evaluation circuit has a high-resistance input region for each of the bit line and the reference line.

According to another feature of the invention, the evaluation circuit is a measurement amplifier or a sense amplifier; and the amplifier amplifies the respective electrical potentials of the bit line and of the reference line in accordance with the difference between the respective electrical potentials such that the respective electrical potentials are amplified to two given potential values.

According to a further feature of the invention, the reference line is configured as a bit line for a further memory cell.

According to another feature of the invention, the memory cell is a dynamic random access memory cell.

According to yet another feature of the invention, the sections formed by the crossover region along the bit line direction have capacitances that substantially compensate one another.

According to another feature of the invention, a plurality of evaluation circuits is disposed as a matrix configuration; a plurality of memory cells is disposed between two evaluation circuits along the bit line; and the evaluation circuits are configured such that, in the word line direction, respective ones of the first and second signal lines form respective crossover regions in every other one of the evaluation circuits.

It has been found that, in particular, the parallel signal lines within an evaluation circuit which are connected to a bit line and an associated reference line also have interfering coupling capacitances. In this case, the resultant coupling noise can likewise lead to misinterpretations of the charge state of the associated storage capacitor and thus to read errors.

According to the invention, therefore, the first and second signal lines have, within the evaluation circuit, at least one crossover region which subdivides the evaluation circuit along the bit line direction into at least two sections whose coupling capacitances mutually compensate for one another. The signal lines of the evaluation circuit preferably have exactly one crossover region which is arranged exactly in the capacitive mid point of the evaluation circuit, so that, on account of the position change of the signal lines of the two sections, the potential difference coupled from an adjacent line into one of the two sections has the same magnitude but an opposite sign. This makes it possible to minimize the coupling noise within the evaluation circuit.

In a further advantageous embodiment of the invention, the input regions of the evaluation circuit for the bit line and the reference line are high-impedance input regions. As a result, the evaluation circuit does not "perceive" the coupling noise outside the evaluation circuit, i.e. on the bit line and the reference line, and can therefore be regarded practically as decoupled from the lines for the short time period of the evaluation. Consequently, the parasitic coupling capacitance can be largely compensated solely by the crossover region of the lines within the evaluation circuit in accordance with the invention. In addition to the reduction of the error rate, the speed of the evaluation operation can thus also be increased again, which benefits the access speed in the memory.

In a further advantageous embodiment of the invention, the evaluation circuits are arranged in rows and columns. Since the capacitance of two lines behaves reciprocally with respect to the distance between the lines, the coupling capacitances of the signal lines of two evaluation circuits that are not directly adjacent make a significantly smaller contribution to the coupling noise than the directly adjacent signal lines. Therefore, it generally suffices to form, in accordance with the invention, the crossover of the signal lines in every second evaluation circuit along the word line.

Other features which are considered as characteristic for the invention are set forth in the appended claims.

Although the invention is illustrated and described herein as embodied in an evaluation circuit for a DRAM, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Referring now to the figures of the drawings in detail the memory device according to the invention is illustrated using the example of a DRAM memory with bidirectional differential sense amplifiers, in which the sense amplifier has a differential bit line pair that makes contact on both sides (bit line shared sense amplifier). However, the crossover of the signal lines within one sense amplifier according to the invention, can also be applied to sense amplifiers which are contact-connected on one side, and which are formed e.g. at the edge of a regular configuration of memory devices, and also other known circuits for the read-out of memory cells. Furthermore, the invention is not just limited to DRAM memories, but also includes other memory elements in which evaluation circuits of the abovementioned type are used to evaluate the memory cell information.

Figure 1:
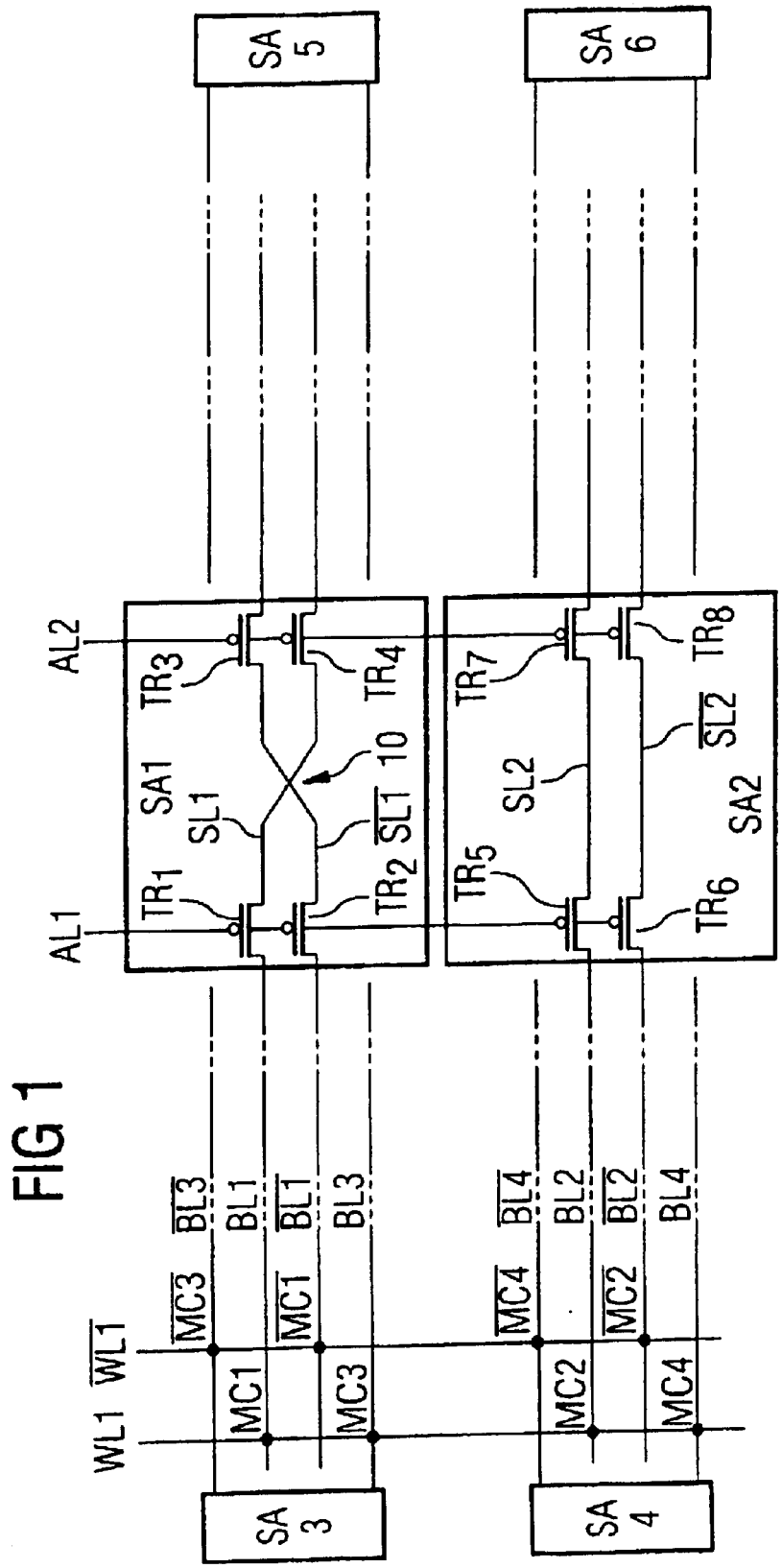
FIG. 1 is a schematic circuit diagram of a configuration of evaluation circuits according to the invention in a dynamic random access memory.

FIG. 1 shows a detail from a regular configuration of memory devices of a DRAM memory with six sense or measurement amplifiers SA1–SA6 and eight bit lines BL1–BL4, $\overline{BL1}$–$\overline{BL4}$, the sense amplifiers SA1, SA3, SA5 being arranged in a first row and the sense amplifiers SA2, SA4, SA6 being arranged in a second row along the bit line direction.

A plurality of word lines WL, $\overline{WL}$ run between the sense amplifiers SA1–SA6 arranged in the bit line direction, a memory cell MC, $\overline{MC}$ including a storage capacitor and transfer transistor in each case being formed in the crossover regions between the word lines and the bit lines BL1–BL4, $\overline{BL1}$–$\overline{BL4}$. In this case, the memory cells MC are preferably arranged in the crossover regions between in each case one of the word lines WL and one of the bit lines BL of a bit line pair and the memory cells $\overline{MC}$ are arranged in the crosssover regions between a word line $\overline{WL}$ adjacent to the word line WL and the other bit line $\overline{BL}$ of a bit line pair.

For the sake of clarity, FIG. 1 only illustrates two word lines WL1, $\overline{WL}$1 and eight memory cells MC1–MC4, $\overline{MC}$1–$\overline{MC}$4 between the sense amplifiers SA1, SA3 and SA2, SA4. The memory cells MC between the sense amplifiers SA1, SA5 and SA2, SA6 are arranged according to the same scheme in the exemplary embodiment illustrated here.

The sense amplifiers SA1, SA2 are configured bidirectional, the signal lines SL1, $\overline{SL}$1, SL2, $\overline{SL}$2 formed within the sense amplifiers SA1, SA2, the course of which signal lines is shown simplified in FIG. 1, being contact-connected by in each case two bit lines BL1, $\overline{BL}$1, and BL2, $\overline{BL}$2, forming a pair, at both sides of the sense amplifiers SA1, SA2. Since the internal circuitry of the sense amplifiers SA3–SA6 is of no further relevance to the understanding of the invention, the sense amplifiers SA3–SA6 are merely illustrated as a black box in FIG. 1. Depending on their position within the regular configuration of memory devices, however, these sense amplifiers SA3–SA6 are contact-connected on both sides or one side by the bit lines BL3, $\overline{BL}$3 and BL4, $\overline{BL}$4 and preferably have circuitry analogous to the sense amplifiers SA1 or SA2. The connection scheme shown in FIG. 1, the sense amplifiers SA1–SA6 being connected to one another alternately via the eight bit lines BL1–BL4 and $\overline{BL1}$–$\overline{BL4}$ combined in pairs, continues in the bit line direction, so that in each case every second sense amplifier SA of a series, in the bit line direction, is contact-connected in each case by the same bit line pair BL1/$\overline{BL1}$–BL4/$\overline{BL4}$.

At the input regions of the bit lines BL1, $\overline{BL1}$, BL2, $\overline{BL2}$, each sense amplifier SA1, SA2 in each case has a transistor switch TR1–TR8 (isolating transistor) which is formed as an n-channel field-effect transistor (N-FET) and isolates the sense amplifier SA1, SA2 from the respective bit line BL1, $\overline{BL1}$, BL2, $\overline{BL2}$. The transistor switches TR1, TR2, TR5, TR6 of one side of the sense amplifiers SA1, SA2 are driven via a first selection line AL1 and the transistor switches TR3, TR4, TR7, TR8 of the other side of the sense amplifiers SA1, SA2 are driven via second selection line AL2, so that, during a read/write operation, the sense amplifiers SA1, SA2 can be selectively connected to the memory cells of one side or the other side of the bit lines BL1, $\overline{BL1}$, BL2, $\overline{BL2}$.

On account of the high integration density and the resultant small dimensions of the N-FET transistor switches TR1–TR8 in the sense amplifiers SA1, SA2, the input regions of the sense amplifiers SA1, SA2 are at relatively high resistance (several kV) even in the activated state.

Each of the memory cells MC, $\overline{MC}$ of the memory configuration has a charge corresponding to one of the two logic data units "0" or "1", the charge having been written to the memory cell MC, $\overline{MC}$ beforehand via the respective bit line BL, $\overline{BL}$.

During a read-out operation of a memory cell MC, $\overline{MC}$, the transfer transistor of the memory cell MC, $\overline{MC}$ is turned on by activation of the corresponding word line WL, $\overline{WL}$, so that the potential of the bit line BL, $\overline{BL}$ which makes contact with the memory cell MC, $\overline{MC}$ is altered from an equalization potential—generated by a short circuit with the complementary bit line $\overline{BL}$, BL—in accordance with the respective charge state of the memory cell MC, $\overline{MC}$.

Since the capacitance of the bit line BL, $\overline{BL}$ is several times greater than the capacitance of an individual memory cell MC, $\overline{MC}$, the potential of the bit line BL, $\overline{BL}$ varies only slightly on account of the charge of the memory cell MC, $\overline{MC}$, especially as this charge originally contained in the memory cell MC, $\overline{MC}$ is reduced by internal interfering factors such as e.g. leakage currents within the memory cell MC, $\overline{MC}$. The potential difference—generated by the charge of the memory cell MC, $\overline{MC}$—between the bit lines BL, $\overline{BL}$ of a bit line pair therefore turns out to be relatively small, and can be altered by capacitive coupling-in of signals of adjacent bit lines at the instant of the read operation in such a way that it is misinterpreted by the sense amplifier SA, which leads to a read error.

In order to reduce the coupling noise, it is possible to reduce the coupling capacitances of the bit lines BL1–BL4, $\overline{BL1}$–$\overline{BL4}$ between the sense amplifiers SA1–SA6 by mutually crossing the bit lines BL1–BL4, $\overline{BL1}$–$\overline{BL4}$.

The evaluation of the potential difference of a bit line BL and its reference bit line $\overline{BL}$ generally takes place in a very short time. The sense amplifier SA, which is usually formed as a symmetrical sensor flip-flop F in a DRAM memory, reacts directly to the potential difference between the two bit lines BL, $\overline{BL}$ and pulls the bit lines BL, $\overline{BL}$, in accordance with their difference, to the ground potential or the full bit line potential. On account of this property of the sense amplifier SA and the transistor switches TR having a high impedance in its input regions, the sense amplifier SA "perceives" the coupling noise on the bit lines BL, $\overline{BL}$ to a much lesser extent than the coupling noise on its internal signal lines SL, $\overline{SL}$. Therefore, the sense amplifier SA can practically be considered as decoupled from the bit lines BL, $\overline{BL}$ for the short time interval of the evaluation.

It is an aim of the invention, therefore, to reduce the interfering coupling noise within the sense amplifier SA1, which is caused by the coupling-in of the potentials of the adjacent bit lines BL2, $\overline{BL2}$, and thus to significantly improve the signal/interference signal ratio of the sense amplifier SA1. For this purpose, the signal lines SL1, $\overline{SL1}$ have, within the sense amplifier SA1, a crossover 10 according to the invention. In this case, this crossover region 10 is essentially arranged in the capacitive center of the sense amplifier SA1, so that the changes—caused e.g. by the coupling-in of the electrical potential of an adjacent signal line SL2, $\overline{SL2}$—in the potential difference between the signal lines SL1, $\overline{SL1}$, on the two partial regions of the signal lines SL1, $\overline{SL1}$ that are formed by the crossover region 10, mutually cancel one another out.

Since the capacitance between the signal lines SL1, $\overline{SL1}$, SL2, $\overline{SL2}$ behaves reciprocally with respect to their distance and the signal line pairs SL1, $\overline{SL1}$, SL2, $\overline{SL2}$ that are adjacent in one plane mutually screen one another, it generally suffices to provide a crossover 10 according to the invention of the associated signal lines SL, $\overline{SL}$ only in the case of every second sense amplifier SA in the word line direction. As is shown in FIG. 1, the sense amplifier SA2 therefore has no crossover 10 of its signal lines SL2, $\overline{SL2}$. This configuration of crossed signal lines SL1, $\overline{SL1}$ and non-crossed signal lines SL2, $\overline{SL2}$ within the sense amplifiers SA1 and SA2 continues systematically in the word line direction, so that only every second sense amplifier SA has a crossed signal line pair SL, $\overline{SL}$.

Figure 2:
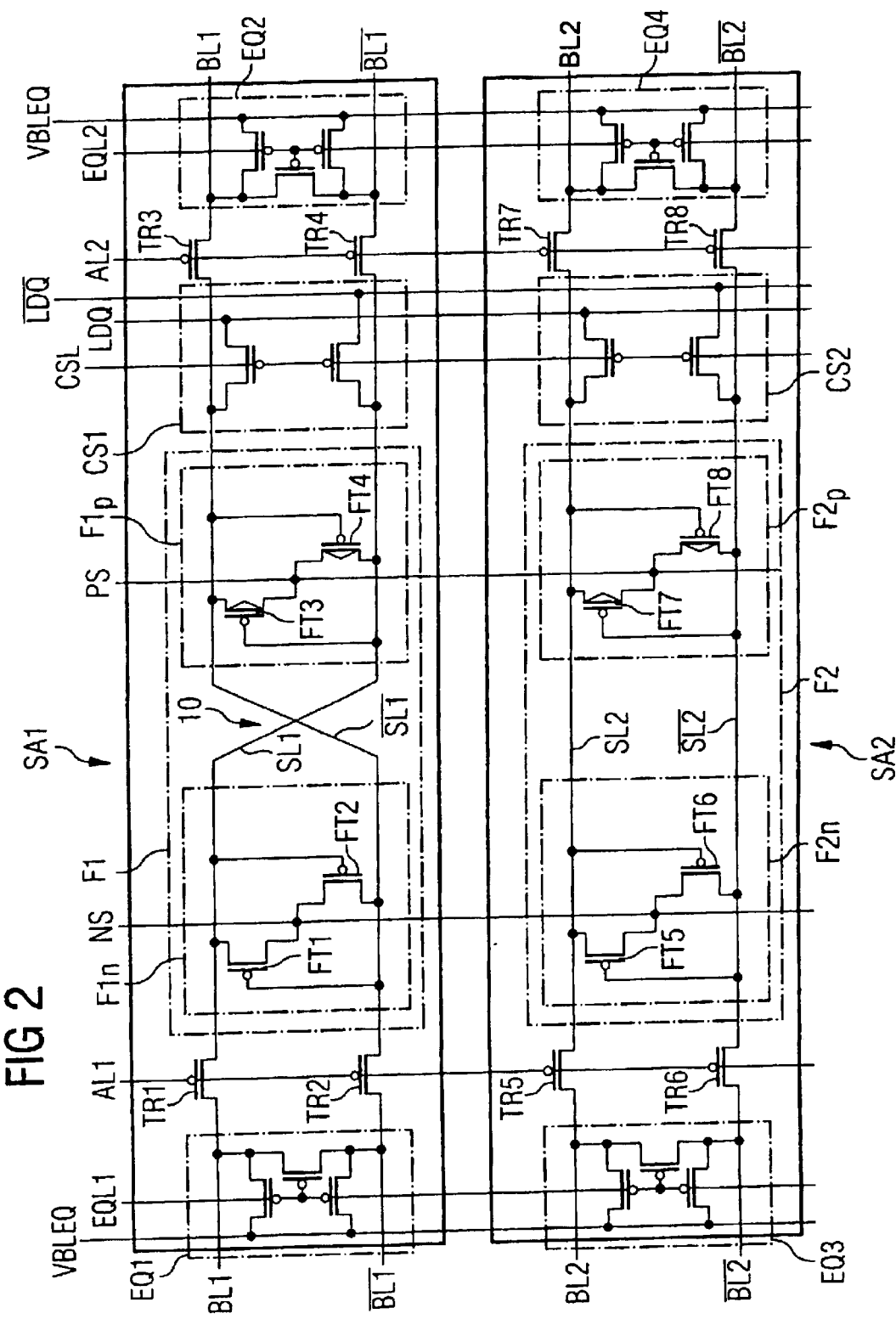
FIG. 2 is a detailed circuit diagram of two evaluation circuits—adjacent in the word line direction—of the configuration according to the invention with crossed signal lines within one of the evaluation circuits.

FIG. 2 shows, by way of example, the internal construction of the two sense amplifiers SA1, SA2 from FIG. 1. In this case, the sense amplifier SA2 is configured as a bistable multivibrator (latch flip-flop) that is contact-connected on both sides and is known per se, the two signal lines SL2, $\overline{SL2}$ running parallel to one another within the sense amplifier SA2. Since the sense amplifier SA1 is essentially configured like the sense amplifier SA2 and differs from the latter only by virtue of the invention's crossover of the signal lines SL1, $\overline{SL1}$, only the sense amplifier SA2 is explained in more detail in the further course of the functional description of the sense amplifiers SA1, SA2.

The sense amplifier SA2 has a virtually symmetrical construction and essentially includes four transistor switches TR5–TR8 which form the input regions of the bit lines BL2, $\overline{BL2}$ and are contact-connected in pairs by the selection lines AL1, AL2, and an evaluation device F2 which is configured as a symmetrical flip-flop circuit and is arranged in a central region of the sense amplifier SA2 between two signal lines SL2, $\overline{SL2}$ running parallel to one another. As shown in FIG. 2, this evaluation device F2 is subdivided into two partial regions $F2_n$ and $F2_p$, which are connected to one another via the signal lines SL2, $\overline{SL2}$. In this case, one partial region $F2_n$ has a first and a second n-channel MOS transistor, whose source electrodes are connected to a low supply potential (e.g. ground potential) of the memory device via a negative sense line NS and further elements (not illustrated here), while the other partial region $F2_p$ has a first and a second p-channel MOS transistor, whose source electrodes are connected to a high supply potential via a positive sense line PS and further elements (likewise not illustrated here). In both partial regions $F2_n$, $F2_p$, in each case the drain electrode of the first MOS transistor and the gate electrode of the second MOS transistor make contact with one of the signal lines SL2, $\overline{SL2}$ and the drain electrode of the second MOS transistor and the gate electrode of the first MOS transistor make contact with the other of the signal lines SL2, $\overline{SL2}$.

The bistable multivibrator F2 of the sense amplifier SA2 has two stable states, the MOS transistors of the respective partial regions F2$_n$, F2$_p$ being turned on in such a way that the high supply potential is present on one of the two signal lines SL2, $\overline{SL2}$ and the low supply potential is present on the other of the two signal lines SL2, $\overline{SL2}$ of the sense amplifier SA2.

In this case, the states of the bistable multivibrator which result from the potential difference of the bit line pair BL2, $\overline{BL2}$ are initiated by activation of the PS and NS lines. The multivibrator then moves independently into one or the other stable end state.

If e.g. the potential difference between the signal lines SL2, $\overline{SL2}$, on account of the charge of a memory cell MC2, $\overline{MC2}$ which acts on the bit lines BL2, $\overline{BL2}$, is polarized such that the signal line SL2 is more positive than the signal line $\overline{SL2}$, then the n-channel MOS transistors FT6 and FT7 move in the direction of increasing conductivity and the p-channel MOS transistors FT5 and FT8 in the direction of increasing blocking, so that the signal line SL2 is pulled to the positive supply potential and the signal line $\overline{SL2}$ to the negative supply potential (or ground potential). The opposite state is established in the event of an opposite initial polarity of the two signal lines SL2, $\overline{SL2}$, the signal line SL2 being pulled to the negative supply potential (or ground potential) and the signal line $\overline{SL2}$ to the positive supply potential. In this case, the circuit is latched in the state reached on account of the mutual coupling of the transistors FT5–FT8, so that even relatively large interference signals which act on the sense amplifier on account of instances of coupling-in can no longer alter the pulled-apart potential difference on the two signal lines SL2, $\overline{SL2}$.

Outside the input regions TR5–TR8, the sense amplifier SA2 in each case has a precharge circuit EQ3, EQ4 on each side of the bit lines BL2, $\overline{BL2}$, the circuit being controlled via a precharge select line EQL1, EQL2. These precharge circuits EQ3, EQ4 produce a potential equalization of the two bit lines BL2, $\overline{BL2}$ before a read-out operation by virtue of the bit lines BL2, $\overline{BL2}$ being short-circuited by the precharge circuits EQ3, EQ4, which are activated via the lines EQL1, EQL2, and being brought to an equalization potential V$_{BLEQ}$.

Between the right-hand partial region F2$p$ of the evaluation circuit F2 and the input regions TR7, TR8, the sense amplifier furthermore has a column select gate circuit CS2 which can be turned on via a column select line CSL and connects a first data line LDQ to the first signal line SL2 and a second data line $\overline{LDQ}$ to the second signal line $\overline{SL2}$, the data lines LDQ, $\overline{LDQ}$ leading to the message source and message sink, respectively.

The sense amplifier SA1 has an internal construction analogous to the sense amplifier SA2. In the capacitive mid point of the sense amplifier SA1, which, on account of the symmetry of the circuit of the sense amplifier 10, is situated approximately in the central region of the circuit, the two signal lines SL1, $\overline{SL1}$, that run essentially parallel to one another have, however, a crossover 10 with one another according to the invention.

Since the signal lines SL, $\overline{SL}$ are electrically isolated from one another in the case of deactivated sense lines NS, PS, they each represent, in a simplified mode of consideration, an electrode of a capacitance arranged perpendicular to the bit line direction. The two partial regions of the circuit of the sense amplifier SA1 that are formed by the crossover point therefore act like two parallel-arranged capacitors whose electrodes are cross-connected to one another.

The potential differences that are coupled into both capacitors of the sense amplifier SA1 are identical in terms of magnitude, but have different signs, so that they mutually cancel one another out.

The position of the crossover point can vary depending on the layout of the evaluation circuit SA1. What is crucial in this case is that the crossover point is arranged in the capacitive mid point, for the determination of which not only the signal lines SL1, $\overline{SL1}$ but also the capacitive properties of the entire evaluation circuit SA1, that is to say also of the components and their leads, have to be taken into account. Furthermore, depending on the layout, the two signal lines SL, $\overline{SL}$ can also cross one another multiply within the evaluation circuit SA. In this case, the crossover points are arranged in such a way that the capacitances of the partial regions of the evaluation circuit SA that are formed by the crossover points mutually compensate for one another.

A crossover 10 according to the invention of the signal lines SL, $\overline{SL}$ in the capacitive mid point of an evaluation circuit SA minimizes the coupling-in of interference signals of adjacent bit lines BL, $\overline{BL}$. In this case, it suffices to cross the signal lines SL, $\overline{SL}$ in every second evaluation circuit SA in the word line direction.

The features of the invention that are disclosed in the above description, the claims and the drawings may be essential both individually and in any desired combination for the realization of the invention in its various embodiments.

We claim:

1. A memory devices comprising:

a memory cell;

an evaluation circuit;

a reference line connected to said evaluation circuit;

a bit line defining a bit line direction;

said memory cell being connected to said evaluation circuit via said bit line;

said evaluation circuit being an amplifier selected from the group consisting of a measurement amplifier and a sense amplifier;

said evaluation circuit containing two partial regions, whereas a first of said partial regions includes a first and a second n-channel MOS transistor and a second of said partial regions includes a first and a second p-channel MOS transistor;

a first signal line, said bit line being connected, within said evaluation circuit, to said first signal line;

a second signal line, said reference line being connected, within said evaluation circuit, to said second signal line;

said first and second signal lines being formed within said evaluation circuit and interconnecting said first and second partial regions of said evaluation circuit;

said bit line and said reference line having respective electrical potentials, said evaluation circuit amplifying a difference between the respective electrical potentials of said bit line and said reference line; and said first and second signal lines having a crossover region within said evaluation circuit, said crossover region forming sections along the bit line direction in said evaluation circuit, a first of said sections containing said first partial region and a second of said sections containing said second partial region of said evaluation circuit, and said sections along the bit line direction having mutually substantially compensating capacitances.

2. The memory device according to claim 1, wherein:
said first and second signal lines extend through said evaluation circuit;
said evaluation circuit has two sides, said bit line and said reference line make contact with a respective one of said first signal line and said second signal line at said two sides of said evaluation circuit; and
said bit line is connected to said memory cell on a first one of said two sides of said evaluation circuit and is connected to a further memory cell on a second one of said two sides of said evaluation circuit.

3. The memory device according to claim 1, wherein said evaluation circuit has a high-resistance input region for each of said bit line and said reference line.

4. The memory device according to claim 1, including a further memory cell, said reference line being configured as a bit line for said further memory cell.

5. The memory device according to claim 1, wherein said memory cell is a dynamic random access memory cell.

6. The memory device according to claim 1, including:
a plurality of evaluation circuits disposed as a matrix configuration;
a plurality of first and second signal lines;
a word line defining a word line direction;
a plurality of memory cells disposed between two of said evaluation circuits along said bit line; and
said evaluation circuits being configured such that, in the word line direction, respective ones of said first and second signal lines form respective crossover regions in every other one of said evaluation circuits.

7. The memory device according to claim 1, wherein said crossover region is disposed in a capacitative center within said evaluation circuit.

* * * * *